(12) United States Patent
Chou et al.

(10) Patent No.: US 8,742,776 B2
(45) Date of Patent: Jun. 3, 2014

(54) MECHANISMS FOR RESISTIVITY MEASUREMENT OF BUMP STRUCTURES

(75) Inventors: You-Hua Chou, Taipei (TW); Mill-Jer Wang, Hsinchu (TW); Pi-Huang Lee, Hsinchu (TW); Jeff Wang, Chu-Pei (TW); Feynmann Chu, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 585 days.

(21) Appl. No.: 13/012,916

(22) Filed: Jan. 25, 2011

(65) Prior Publication Data

US 2012/0133379 A1    May 31, 2012

Related U.S. Application Data

(60) Provisional application No. 61/418,174, filed on Nov. 30, 2010.

(51) Int. Cl.
  *G01R 27/08* (2006.01)
(52) U.S. Cl.
  USPC .............................. 324/724; 324/691; 324/722

(58) Field of Classification Search
  USPC ............ 324/525, 527–528, 537, 724, 754.03, 324/756.03, 762.01–762.06, 763.01
  See application file for complete search history.

(56) References Cited

U.S. PATENT DOCUMENTS

| | | | |
|---|---|---|---|
| 6,313,651 B1 * | 11/2001 | Hembree et al. | 324/756.02 |
| 6,531,774 B1 * | 3/2003 | Do et al. | 257/727 |
| 7,078,922 B2 * | 7/2006 | Kirby | 324/756.05 |
| 8,305,094 B2 * | 11/2012 | Chang | 324/691 |
| 2006/0145715 A1 * | 7/2006 | Salmon | 324/754 |
| 2009/0058435 A1 * | 3/2009 | Nakamura | 324/719 |

* cited by examiner

*Primary Examiner* — Arleen M Vazquez
*Assistant Examiner* — Robert P Alejnikov, Jr.
(74) *Attorney, Agent, or Firm* — Lowe Hauptman & Ham, LLP (57) ABSTRACT

The embodiments described above provide mechanisms for bump resistivity measurement. By using designated bumps on one or more corners of dies, the resistivity of bumps may be measured without damaging devices and without a customized probing card. In addition, bump resistivity may be collected across the entire wafer. The collected resistivity data may be used to monitor the stability and/or health of processes used to form bumps and their underlying layers.

20 Claims, 6 Drawing Sheets

MECHANISMS FOR RESISTIVITY MEASUREMENT OF BUMP STRUCTURES

CROSS-REFERENCE TO RELATED APPLICATIONS

The present application claims priority of U.S. Provisional Patent Application Ser. No. 61/418,174, filed on Nov. 30, 2010, which is incorporated herein by reference in its entirety.

BACKGROUND

Modern integrated circuits are made of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (UBM) layer located between the bump and an input/output (I/O) pad.

In semiconductor manufacturing, a semiconductor structure or device is continuously tested to maintain the quality of the structure of device and to control the manufacturing process. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1A:
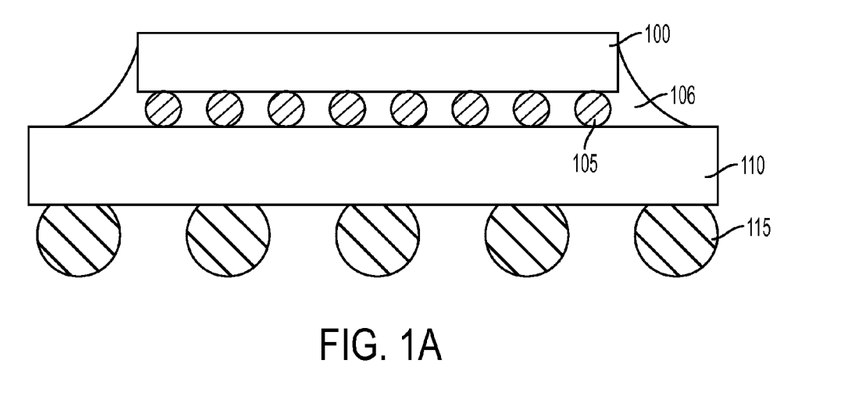
FIG. 1A shows a schematic diagram of an integrated circuit (IC) chip on a package substrate, in accordance with some embodiments.

As mentioned above, flip-chip packaging utilizes bumps to establish electrical contact between a chip's I/O pads and the substrate or lead frame of the package. FIG. 1A shows a schematic diagram of an integrated circuit (IC) chip 100 on a package substrate 110, in accordance with some embodiments. IC chip 100 is packaged with flip-chip packaging by forming bumps 105 on the front-side of the IC chip 100. Bumps 105 electrically and possibly physically contact the I/O pads of the IC chip 100. The IC chip 100 with the bumps 105 is flipped over to be placed on a package substrate 110, which could be connected to ball grid array (BGA) balls 115. The space between and around the IC chip 100, the bumps 105 and the substrate 100 could be filled with an under-fill material 106. The embodiment shown in FIG. 1A is merely an example. IC chip 100 with bumps 105 could be applied on other types of substrates, such as an application board, and a substrate with embedded passive and/or active devices.

After bumps, such as bumps 105, are formed on an IC chip, such as chip 100, it is desirable to test the resistance of the bump structures to determine the quality of formation of the bumps and their underlying layers, such as one or more under bump metallurgy (UBM) layers, re-distribution lines (RDL), a passivation layer, and/or a post passivation interconnect (PPI) layer. The resistance data collected from the bump structures allows users to determine if the bumps and their underlying layers have been formed properly. A higher than normal resistivity could indicate problems in part of the processing sequence of bump formation.

In some embodiments, an under-bump metallurgy (UBM) is formed, followed by the formation of a bump on the UBM during a bump formation process. The UBM formation may include forming a copper seed layer and forming and patterning a mask on the copper seed layer so that a portion of the copper seed layer is exposed through an opening in the mask. A plating step is then performed to plate a thick copper layer on the exposed portion of the copper seed layer.

Figure 1B:
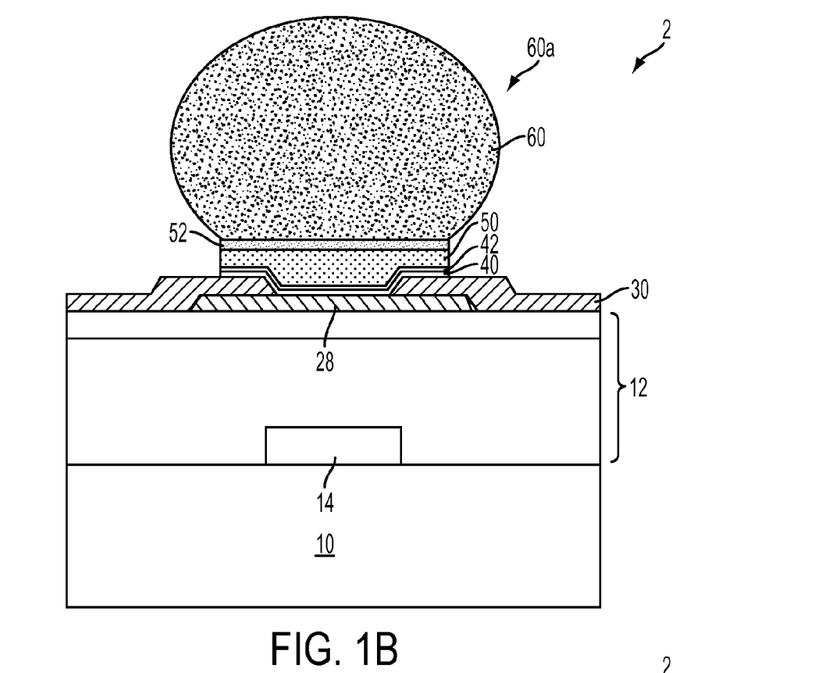
FIG. 1B shows a bump structure on a wafer, in accordance with some embodiments.

FIG. 1B shows a bump structure on a wafer 2 with a substrate 10, in accordance with some embodiments. Substrate 10 may be a semiconductor substrate, such as a bulk silicon substrate, although it may include other semiconductor materials, such as group III, group IV, and/or group V elements. Semiconductor devices 14, such as transistors, may be formed at the surface of substrate 10. An interconnect structure 12, which includes metal lines and vias (not shown) formed therein and connected to semiconductor devices 14, is formed over substrate 10. The metal lines and vias may be formed of copper or copper alloys, and may be formed using the well-known damascene processes. Interconnect structure 12 may include commonly known inter-layer dielectrics (ILDs) and inter-metal dielectrics (IMDs).

A metal pad 28 is formed over interconnect structure 12. Metal pad 28 may comprise aluminum, and hence may also be referred to as aluminum pad 28, although it may also be formed of, or include, other materials, such as copper, silver, gold, nickel, tungsten, alloys thereof, and/or multi-layers thereof. Metal pad 28 may be electrically connected to semiconductor devices 14, for example, through underlying interconnection structure 12. In some embodiments, a passivation layer 30 is formed to cover edge portions of metal pad 28. The passivation layer 30 may be formed of polyimide or other known dielectric materials. Additional passivation layers may be formed over interconnect structure 12 and at the same level, or over, metal pad 28. The additional passivation layers may be formed of materials such as silicon oxide, silicon nitride, un-doped silicate glass (USG), polyimide, and/or multi-layers thereof.

An opening is formed in passivation layer 30, with metal pad 28 exposed. A diffusion barrier layer 40 and a thin seed layer 42 are formed to cover the opening with the diffusion barrier layer 40 in contact with the metal pad 28. Diffusion barrier layer 40 may be a titanium layer, a titanium nitride layer, a tantalum layer, or a tantalum nitride layer. The materials of seed layer 42 may include copper or copper alloys, and hence is referred to as copper seed layer 42 hereinafter. However, other metals, such as silver, gold, aluminum, and combinations thereof, may also be included. In some embodiments, diffusion barrier layer 40 and copper seed layer 42 are formed using sputtering.

After the barrier layer 40 and copper seed layer 42 are formed, a mask is formed over the copper seed layer 42 to allow a copper layer 50 to be plated on the exposed surface of copper seed layer 42, in accordance with some embodiments. During the formation of the mask, residue may remain on the copper seed layer 42. The residue needs to be removed. The process is called "descum," which may result in oxidation of the copper seed layer 42. Oxidized surface of the copper seed layer 42 may affect the copper plating process. A reduction process may be involved to reduce the oxidized surface to copper. A metal layer 52 may be optionally formed on the copper layer 50. In some embodiments, metal layer 52 is a nickel-containing layer comprising, for example, a nickel layer or a nickel alloy layer by plating. Next, solder layer 60 is formed on nickel layer 52, for example, by plating. Solder layer 60 may be a lead-free pre-solder layer formed of, for example, SnAg, or a solder material, including alloys of tin, lead, silver, copper, nickel, bismuth, or combinations thereof.

Afterwards, the mask is removed. As a result, portions of copper seed layer 42 underlying the mask are exposed. The exposed portions of copper seed layer 42 are then removed by a flash etching. Next, the exposed portions of diffusion barrier layer 40 are also removed. A solder reflowing process is then performed to form solder layer 60 as a solder bump 60a, as shown in FIG. 1B.

Figure 1C:
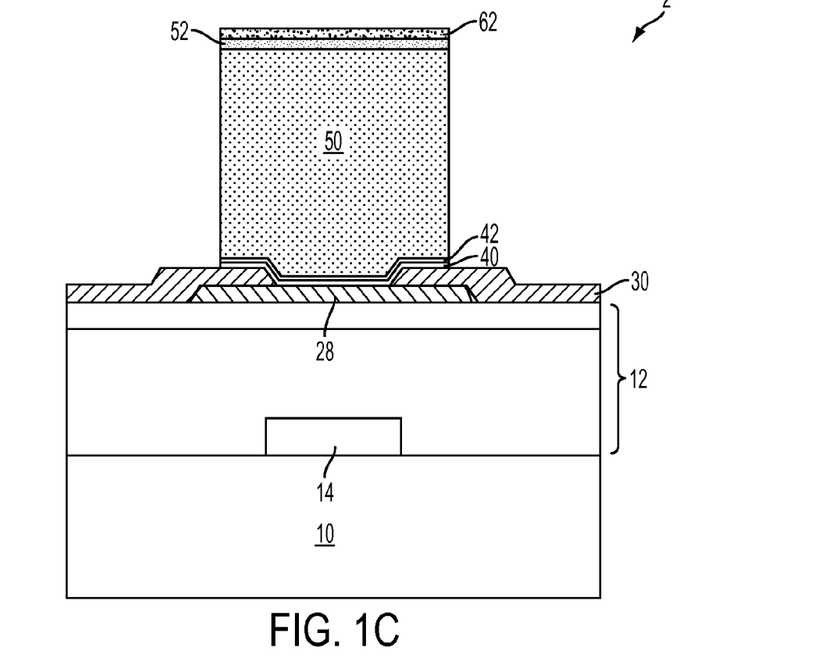
FIG. 1C shows a copper post on a wafer with a substrate, in accordance with some embodiments.

In alternative embodiments, as shown in FIG. 1C, the thickness of copper layer 50 is increased so that copper layer 50 becomes a copper post (or pillar). In some embodiments, after the optional formation of metal layer 52 on copper post 50 and before the removal of the mask, solder layer 62, which may be a thin solder layer, may be plated on metal layer 52. The embodiments shown in FIGS. 1B and 1C are only two examples; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

The description above regarding formation of metal bumps, which include solder bumps and copper posts, indicates that there are quite a few process operations involved. If one of the process operations is not performed properly, the quality of the bumps and/or their underlying layers could be affected. It would be desirable to test the quality of the bumps in order to determine if the formation process is functioning properly. Resistivity of the bumps and their underlying layers can be tested to reveal the quality of the bumps and their formation process.

Figure 2A:
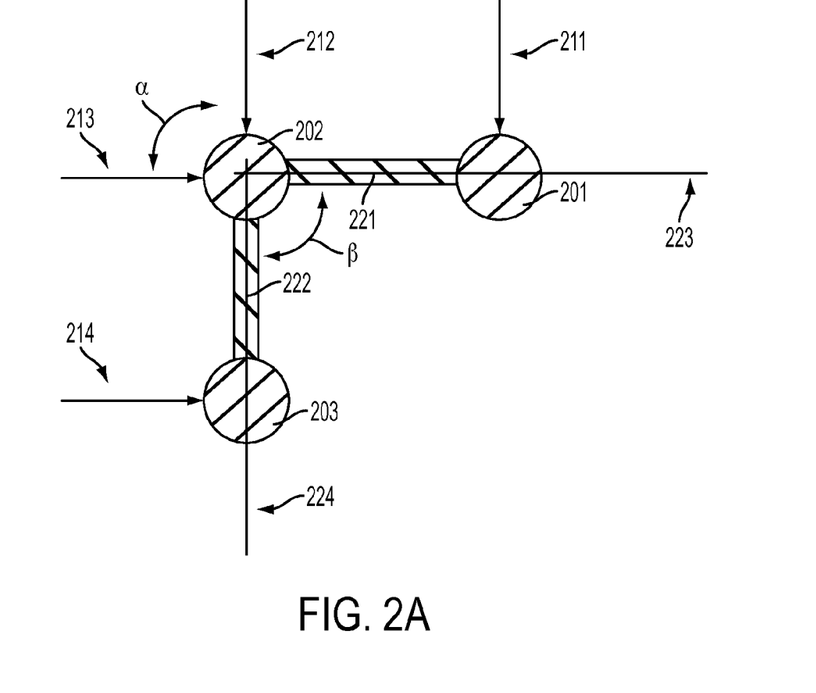
FIG. 2A shows a top view of a bump resistivity testing structure, in accordance with some embodiments.

FIG. 2A shows a top view of a bump resistivity testing structure, in accordance with some embodiments. The structure includes three bumps 201, 202, 203 and four probes 211, 212, 213, and 214 for resistivity testing, in accordance with some embodiments. In some embodiments, probes 212 and 213 for bump 202 are placed at an non-zero angle "α" (not parallel) to provide sufficient room between these two probes. In some embodiments, the angle α is substantially equal to 90°. Bumps 201 and 202 are connected to each other via a conductive structure 221. Similarly, bumps 202 and 203 are connected to each other via a conductive structure 222. The conductive structures 221 and 222 may be part of a metal pad, such as metal pad 28 described above, or be part of a redistribution layer (RDL). By passing a current through bumps 202 and 203 and measuring the voltage drop between bumps 202 and 201, the resistivity of the bump 202 and its underlying layers can be measured. A line 223 connecting the centers of bumps 201, 202, and a line 224 connecting the centers of bumps 202 and 203 is at an angle β. Angle β can be any angle as long as bump 201 and bump 203 do not come in contact. In some embodiments, angle β is in a range from about 30° to about 330°. In some embodiments, the angle β is about 90° (or lines 223 and 224 are substantially perpendicular). An angle of about 90° for β provides sufficient space between probes 212 and 213 and also bumps 201-203 do not occupy too much space on the chip. However, other angles for β are also possible.

Figure 2B:
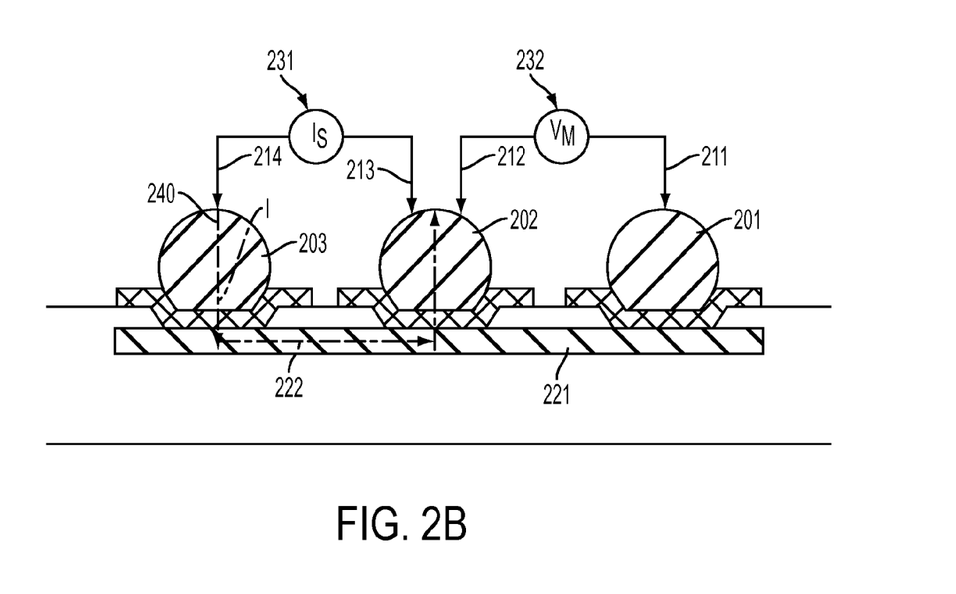
FIG. 2B shows a side view of FIG. 2A, in accordance with some embodiments.

FIG. 2B shows a side view of FIG. 2A, in accordance with some embodiments. A current I is applied by between probe 214 and 213. The instrument that supplies the current I is labeled as "Is" 231. The current goes through bump 203 through conductive structure 222 to reach bump 202. While the current "I" is applied, the voltage drop "V" across bump 202, UMB layers, such as layers 40, 42, 50, and 52 of FIG. 1B, and metal pad 28 is measured by voltage measurement instrument "Vm" 232. Dotted line 240 shows the path of current "I". Equation (1) shows the relationship between "V" and "I".

$$V/I=R \tag{1}$$

R is resistivity of the bump structure 202 and its underlying layers. If bump 202 has the configuration as shown in FIG. 1B and bumps 201, 202, and 203 are connected via metal pad 28, R can be shown as equation (2).

$$R=R_{60}+R_{52}+R_{50}+R_{42}+R_{40}+R_{28} \tag{2}$$

$R_{60}, R_{52}, \ldots R_{28}$ stand for resistivity of solder layer 60, metal layer 52, ... and metal pad 28 respectively. If there is an RDL over the metal pad 28, resistivity R is equation (2) should also include the resistivity of the RDL.

By measuring the resistivity of bumps, the health of the process operations for forming the bumps and underlying layers may be monitored. A sudden increase in the resistivity trend may indicate an abnormality in at least one process operation. Engineers and/or technicians may work to identify the process source(s) and take actions to correct the problem(s). In addition, the resistivity data of the bumps may be used to determine the types of chips and/or substrates that can be connected to the bumps without exceeding the resistivity specification.

Bumps formed on the IC chips, such as IC chip 100 of FIG. 1A, most likely are connected to active devices. As a result, applying current on bumps to measure resistivity of bumps may damage the devices connected to the bumps. To prevent such damage from occurring, bumps in the formation (or similar formation) described in FIG. 2A on failed dies are used. Often the edge dies have a higher failure rate and are used for measurement of bump resistivity. However, measuring bump resistivity on edge or failed dies prevents resistivity data collection across the entire wafer (or substrate). Further, for a foundry chip manufacturer, such as Taiwan Semiconductor Manufacturing Company, that manufactures various types (with different designs) of chips for numerous customers, different bump probe cards are needed for various bump designs and layouts.

Therefore, it is desirable to have bumps designated for resistivity measurement. Such bumps should be placed in a designated area(s) of chips. The designated area(s) should be at a consistent location(s) regardless of the chip design.

Figure 3A:
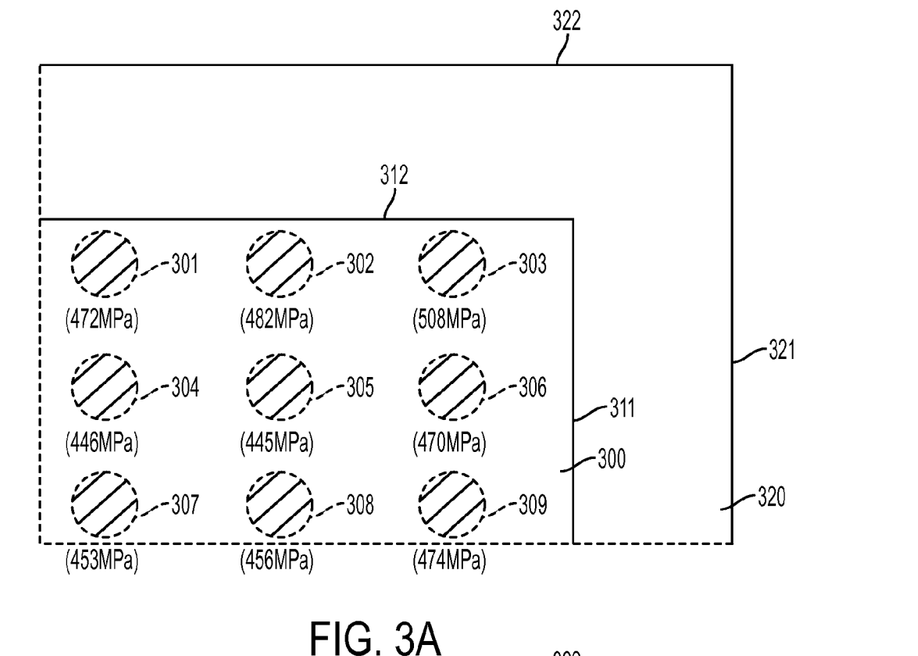
FIG. 3A shows a top view of various bumps sandwiched between a portion of an IC chip and a portion of a package substrate, in accordance with some embodiments.

FIG. 3A shows a top view of various bumps 301-309 sandwiched between a portion of an IC chip 300 and a portion of a package substrate 320, in accordance with some embodiments. FIG. 3A shows nine bumps, which are only a portion of a larger number of bumps. There are bumps 301-309, with bump 303 at a corner. There are additional bumps (not shown) neighboring bumps 301, 304, 307, 308 and 309. Lines 311 and 312 are edges of IC chip 300. Lines 321 and 322 are edges of substrate 320. The total size of the IC chip 300 is about 9.5×6.3 mm$^2$ and the total size of substrate 320 is about 13.4×13.4 mm$^2$. The bumps are solder bumps.

The simulated stress shows that bump 303 has the highest stress of 508 megapascals (MPa) at the center of the bump. The stress at each bump is highest at the center of the bump and decreases with radius. The stress value 508 MPa is the peak stress of the bump. The stresses of other bumps along the edges (lines 311 and 312) of the IC chip 300, such as bumps 301, 302, 306, and 309, are in a range from about 470 Mpa, to about 482 MPa, which are less than the stress of bump 303 (i.e., about 508 MPa). However, stress of these bumps along the edge are higher than stresses of bumps not along the edges, such as bump 304, 305, 307, and 308, which are in a range from about 446 MPa to about 456 MPa. The stress of corner bump 303 (508 MPa) is much higher than neighboring bumps. Due to the higher stress, bump 303 and its underlying layers have a higher risk of delamination, such as forming cracks between the bump and the underlying layers, and/or the underlying dielectric layer(s) delaminating from the insulated metal structures, with further processing and handling. For example, cracks may form between the bump and the underlying layer, and/or the underlying dielectric layer(s), such as extremely low dielectric (or low-K) (ELK) inter-level dielectric layer(s) (ILD) delaminating from the insulated metal structures, such as metal layers. Such issues of high corner stress will likely worsen with advancement of technology nodes, which will produce devices operating at higher frequencies. High frequency devices would generate more heat, which increases the level of thermal mismatch and stress.

Figure 3B:
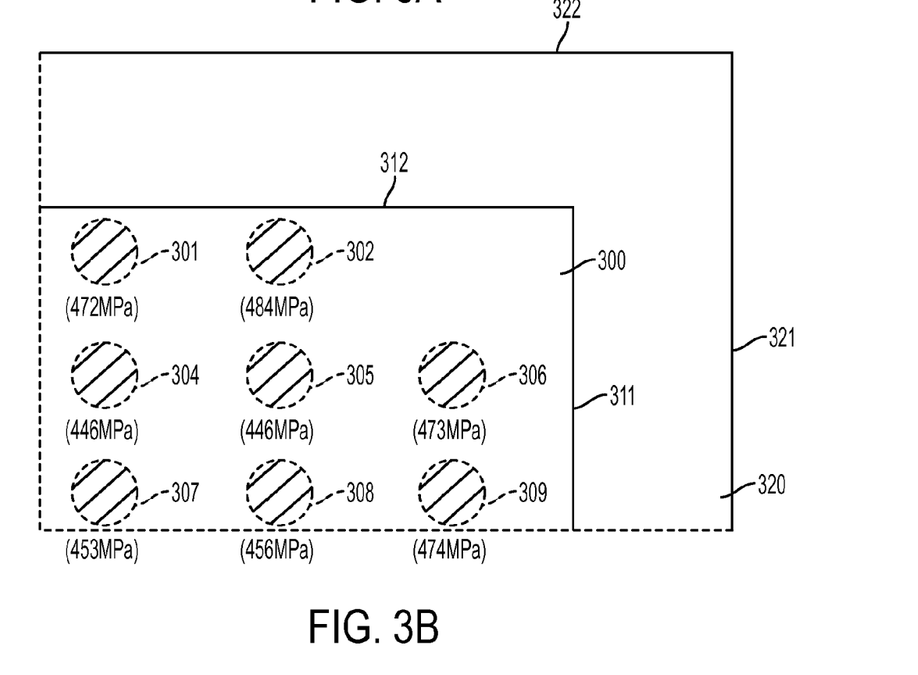
FIG. 3B shows a top view of a structure similar to the structure of FIG. 3A with one corner bump removed, in accordance with some embodiments.

FIG. 3B shows the substrates of FIG. 3A with bump 303 removed, in accordance with some embodiments. The simulated stress results show that the stresses of other bumps are not affected much due to the removal of the corner bump 303. With the corner bump 303 being removed, bumps 302 and 306 become the new corner bumps, whose stresses are in a range from about 473 MPa to about 484 MPa, which are much lower than the old corner stress.

Figure 4A:
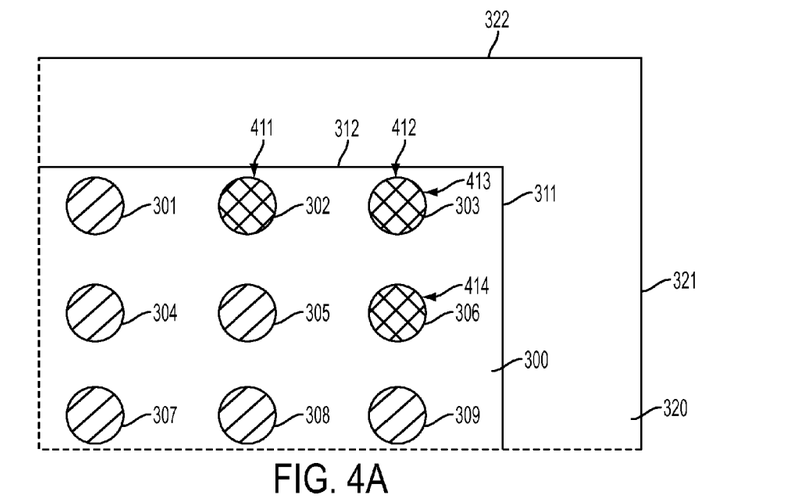
FIG. 4A shows three corner bumps being designated as bumps for measuring resistivity, in accordance with some embodiments.

Based on the stress simulation results described above in FIGS. 3A and 3B, it would be advisable to make the corner area (area for corner bump 303) an exclusion area for bumps that connect to devices due to the concern of high bump stress. The area can be used to form the corner bump 202 of FIG. 2A. Bumps 302 and 306 may be used like bumps 201 and 203 of FIG. 2A for resistivity measurement. If bumps 302, 303 and 306 are designated for resistivity measurement, they can be designed to not be connected to devices to eliminate concerns over damaging devices during resistivity measurement. Other bumps can be used for connection with devices. FIG. 4A shows the 3 corner bumps 302, 303 and 306 being designated as bumps for measuring resistivity, in accordance with some embodiments. FIG. 4A shows that 4 probes 411-414 can be used in a manner similar to probes 211-214 of FIG. 2A. Although corner bump 303 is still at high stress of delamination with further processing and handling, the adhesion and integrity between bump 303 and its underlying layers are fine during resistivity measurement. If there is delamination issue after further processing, the delamination would not cause any device failure, since bump 303 is not connected to any device.

Figure 4B:
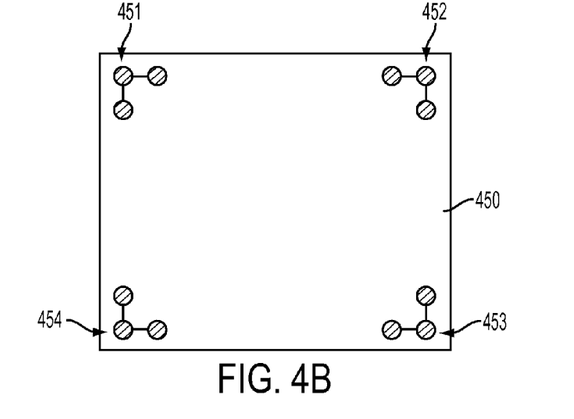
FIG. 4B shows an IC chip, with four corners with bumps for resistivity testing, in accordance with some embodiments.

FIG. 4B shows a die 450, with four corners 451-454 with bumps for resistivity testing, in accordance with some embodiments. After the wafer is sawed, die 450 becomes an IC chip, such as chip 100 of FIG. 1A or chip 300 of FIGS. 3A-4A. Any of the corners may be used to place bumps for resistivity measurement. With designated bumps for resistivity measurement, any die on the substrate can be measured to determine the distribution of resistivity across the wafer and resistivity uniformity. With measurement across the wafer, process uniformity and/or abnormality across the wafer can be determined. In addition, with designated bumps for resistivity measurement being placed at one of the four corners, the number of probe cards that need to be prepared for such measurement can be drastically reduced. The probe cards can be grouped by bump size and pitch, instead of one for each chip design as described above.

Figure 4C:
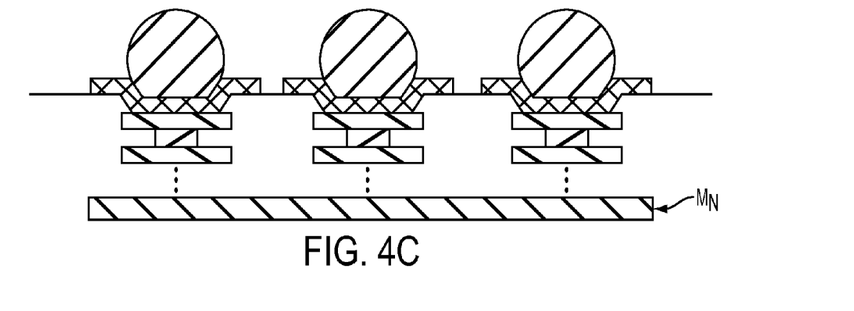
FIG. 4C shows another bump resistivity measurement structure, in accordance with some embodiments.

The structure for bump resistivity described in FIG. 2A relies on a metal pad and/or an RDL for interconnection between bumps. Alternatively, the interconnection can be provided by different metal layers, such as M1, M2, ... Mtop, underneath the metal pad. FIG. 4C shows another bump resistivity measurement structure, in accordance with some embodiments. The structure of FIG. 4C is similar to the structure of FIG. 2B with the exception that the interconnection between bumps is provided by a metal layer, $M_N$, under the passivation. As mentioned above, the $M_N$ can be any metal layer, such as M1, M2, ..., or Mtop.

Figure 5:
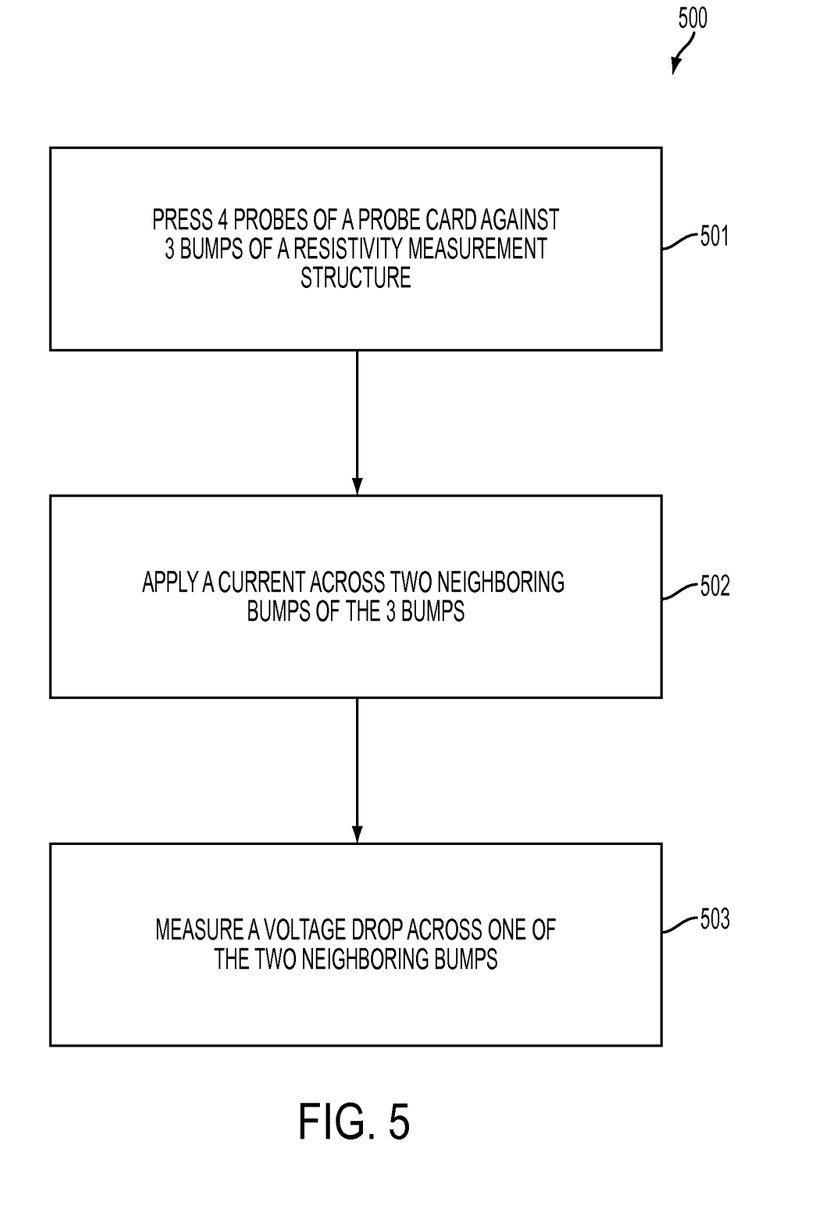
FIG. 5 shows a process flow for measuring resistivity of bumps with the structure described above, in accordance with some embodiments.

FIG. 5 shows a process flow 500 for measuring resistivity of bumps with the structure described above, in accordance with some embodiments. At operation 501, 4 probes of a probe card are pressed against 3 bumps of a bump resistivity measurement structure. A few embodiments of the bump resistivity measurement structure have been described above in FIGS. 2A, 2B, and 4A-4C. At operation 502, a current is applied across two neighboring bumps of the bump resistivity measurement structure by using two of the probes. At operation 503, the voltage drop across one of the two neighboring bumps is measured by using the other two of the probes. The resistivity of the bump and its underlying layer(s) can be calculated from the current passed and the voltage drop measured.

The embodiments described above provide mechanisms for bump resistivity measurement. By using designated bumps on one or more corners of dies, the resistivity of bumps may be measured without damaging devices and without a customized probing card. In addition, bump resistivity may be collected across the entire wafer. The collected resistivity data may be used to monitor the stability and/or health of processes used to form bumps and their underlying layers.

In one embodiment, a resistivity test structure on a substrate is provided. The resistivity test structure includes a first, a second, and a third bumps formed on the substrate. The first, the second, and the third bumps are formed on a corner of a die on the substrate, and the first, the second, and the third bumps are not connected to active devices and are for resistivity measurement. The resistivity test structure also includes a first conductive structure connecting the first and the second bumps, and a second conductive structure connecting the second and the third bumps. A voltage drop is measured across the second bump by using the second and the third bumps when a current is applied between the first and the second bumps to calculate a resistivity of the second bump and underlying conductive layers of the second bump.

In another embodiment, a resistivity test structure on a substrate is provided. The resistivity test structure includes a first, a second, and a third bumps formed on the substrate. The first, the second, and the third bumps are formed on a corner of a die on the substrate, and the first, the second, and the third bumps are not connected to active devices and are for resistivity measurement. The resistivity test structure also includes a first conductive structure connecting the first and the second bumps, and a second conductive structure connecting the second and the third bumps. A voltage drop is measured across the second bump by using the second and the third bumps when a current is applied between the first and the second bumps to calculate a resistivity of the second bump and underlying conductive layers of the second bump. The underlying layers of the second bump include under bump metallurgy layers and a portion of the first conductive structure under the second bump.

In yet another embodiment, a method of measuring resistivity of a bump and its underlying conductive layer is provided. The method includes pressing four probes of a probe card against three bumps of a resistivity measurement structure, and the three bumps are formed on a corner of a die on a substrate. The three bumps are not connected to active devices. A first and a second bump of the three bumps are connected by a first conductive structure and the second and a third bump of the three bumps are connected by a second conductive structure. Two of the four probes are pressed against the second bump. The method also includes applying a current across the first and the second bumps by using two of the four probes with one probe on each bump. The method further includes measuring a voltage drop across the second bump and its underlying conductive layers by using the remaining two of the four probes with one probe on each bump.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced. Accordingly, the present embodiments are to be considered as illustrative and not restrictive, and the embodiments are not to be limited to the details given herein, but may be modified within the scope and equivalents.

The invention claimed is:

1. A resistivity test structure on a substrate, comprising:
    a first bump, a second bump, and a third bump formed on the substrate, wherein the first, the second, and the third bumps are collectively formed on a corner of a die on the substrate, and wherein the first, the second, and the third bumps are not connected to active devices and are for resistivity measurement, and the first, the second and the third bumps form a triangle shape with the second bump disposed closest to a corner point of the die;
    a first conductive structure connecting the first and the second bumps; and
    a second conductive structure connecting the second and the third bumps, wherein a voltage drop is measured across the second bump by using the second and the third bumps when a current is applied between the first and the second bumps to calculate a resistivity of the second bump and underlying conductive layers of the second bump.

2. The resistivity test structure of claim 1, wherein the underlying layers of the second bump include under bump metallurgy (UBM) layers and a portion of the first conductive structure under the second bump.

3. The resistivity test structure of claim 1, wherein each of the first, the second and the third bumps are made of solder or copper.

4. The resistivity test structure of claim 2, wherein each of the first, the second, and the third bumps have the under bump metallurgy (UBM) layers, and wherein the first and the second conductive structures connect the first, the second, and the third bumps via the UBM layer.

5. The resistivity test structure of claim 2, wherein each of the first, the second, and the third bumps are made of solder and the UBM layers include a diffusion barrier layer, a copper seed layer, a copper layer, and a nickel layer.

6. The resistivity test structure of claim 2, wherein each of the first, the second, and the third bumps are made of copper and the UBM layers include a diffusion barrier layer and a copper seed layer.

7. The resistivity test structure of claim 1, wherein each of the first, the second, and the third bumps are made of copper and there are a respective nickel layer and a respective solder layer over the first, the second, and the third bumps.

8. The resistivity test structure of claim 1, wherein each of the first and the second conductive structures are made of a conductive layer selected from a group consisting of a metal pad, a redistribution line, or a metal interconnect layer.

9. The resistivity test structure of claim 2, wherein the resistivity includes resistivity of the second bump, resistivity of the portion of the first conductive structure under the second bump, and resistivity of the UBM layers.

10. The resistivity test structure of claim 1, wherein the first conductive structure is connected to the second conductive structure.

11. The resistivity test structure of claim 1, wherein there are a fourth bump, a fifth bump, and a sixth bump similar to the first, the second, and the third bumps for resistivity measurement, wherein the fourth, the fifth, and the sixth bumps are collectively placed at another corner of the die.

12. A resistivity test structure on a substrate, comprising:
    a first bump, a second bump, and a third bump formed on the substrate, wherein the first, the second, and the third bumps are collectively formed on a corner of a die on the substrate, the second bump disposed closest to a corner point of the die, and wherein the first, the second, and the third bumps are not connected to active devices and are for resistivity measurement;

a first conductive structure connecting the first and the second bumps; and a second conductive structure connecting the second and the third bumps, wherein a voltage drop is measured across the second bump by using the second and the third bumps when a current is applied between the first and the second bumps to calculate a resistivity of the second bump and underlying conductive layers of the second bump, and wherein the underlying layers of the second bump include under bump metallurgy layers and a portion of the first conductive structure under the second bump.

13. A method of measuring resistivity of a bump and its underlying conductive layer, comprising:

pressing four probes of a probe card against three bumps of a resistivity measurement structure, wherein the three bumps are formed on a single corner of a die on a substrate, and wherein the three bumps are not connected to active devices; and wherein a first and a second bumps of the three bumps are connected by a first conductive structure and the second and a third bumps of the three bumps are connected by a second conductive structure, and wherein two of the four probes are pressed against the second bump;

applying a current across the first and the second bumps by using two of the four probes with one probe on each bump; and measuring a voltage drop across the second bump and its underlying conductive layers by using the remaining two of the four probes with one probe on each bump.

14. The method of claim 13, wherein the resistivity of the second bump and its underlying conductive layer is calculated by dividing the applied current with the measured voltage drop.

15. The method of claim 13, wherein the underlying conductive layers of the second bump includes UBM layers and the first conductive structure.

16. The method of claim 13, wherein the two probes that are pressed against the second bumps are at an angle about 90° from one another.

17. The method of claim 13, wherein the three bumps are not connected to devices.

18. The method of claim 13, wherein the resistivity measurement is performed on different dies across the substrate.

19. The resistivity test structure of claim 12, wherein a first line connecting centers of the first and the second bumps and a second line connecting centers of the second and the third bumps are at an angle in a range from about 30° to about 330°.

20. The resistivity test structure of claim 1, wherein centers of the first and the second bumps and centers of the second and the third bumps are at an angle in a range from about 30° to about 330°.

* * * * *